United States Patent [19]

Dueber et al.

[11] Patent Number: 5,536,620
[45] Date of Patent: Jul. 16, 1996

[54] PLIABLE, AQUEOUS PROCESSABLE, PHOTOPOLYMERIZABLE PERMANENT COATING FOR PRINTED CIRCUITS

[75] Inventors: Thomas E. Dueber; Joseph E. Gervay, both of Wilmington, Del.

[73] Assignee: E. I. Du Pont de Nemours and Company, Wilmington, Del.

[21] Appl. No.: 300,286

[22] Filed: Sep. 2, 1994

Related U.S. Application Data

[63] Continuation-in-part of Ser. No. 987,899, Dec. 8, 1992, abandoned, which is a continuation-in-part of Ser. No. 840,775, Feb. 24, 1992, abandoned.

[51] Int. Cl.$^6$ .................................................. G03C 1/73
[52] U.S. Cl. ........................... 430/284.1; 430/281.1; 428/901
[58] Field of Search .................... 430/284, 281, 430/906, 910

[56] References Cited

U.S. PATENT DOCUMENTS

| | | | |
|---|---|---|---|
| 3,469,982 | 9/1969 | Celeste | 96/35.1 |
| 3,547,730 | 12/1970 | Cohen et al. | 156/345 |
| 4,247,621 | 1/1981 | Sano et al. | 430/269 |
| 4,438,189 | 3/1984 | Geissler et al. | 430/280 |
| 4,937,172 | 6/1990 | Gervay | 430/280 |
| 4,987,054 | 1/1991 | Sondergeld et al. | 430/275 |
| B1 4,621,043 | 6/1988 | Gervay | 430/281 |

FOREIGN PATENT DOCUMENTS

| | | |
|---|---|---|
| 0115354 | 8/1984 | European Pat. Off. . |
| 0430175 | 6/1991 | European Pat. Off. . |
| 2509842 | 9/1975 | Germany . |

*Primary Examiner*—George F. Lesmes
*Assistant Examiner*—Laura Weiner

[57] ABSTRACT

Aqueous processable photopolymerizable compositions containing (a) a cobinder system, (b) an acrylated urethane monomeric component; (c) a photoinitiator system; and (d) a thermal cross-linking agent are disclosed, which as cured compositions, are flexible and can be used as permanent coatings for the protection of printed circuitry.

16 Claims, No Drawings

PLIABLE, AQUEOUS PROCESSABLE, PHOTOPOLYMERIZABLE PERMANENT COATING FOR PRINTED CIRCUITS

CROSS REFERENCE TO RELATED PATENT APPLICATION

This application is a continuation-in-part of application 07/987,899, filed Dec. 8, 1992, which is a continuation-in-part of application Ser. No. 07/840,775, filed Feb. 24, 1992, and both now abandoned.

BACKGROUND OF THE INVENTION

The present invention is directed to aqueous processable, photopolymerizable compositions having superior flexibility while preserving important properties for their use as permanent coatings for the protection of printed circuitry.

Photopolymerizable resist materials are known, for example, from U.S. Pat. Nos. 3,469,982 and 3,547,730, which describe a film resist with a sandwich structure in the form of a photopolymerizable layer between a cover sheet and a temporary support. This film resist can, for instance, be laminated on a copper base, exposed imagewise and developed with organic solvents or aqueous solutions, whereby a defined resist layer is formed. Typically the copper base for a printed circuit board is rigid, with limited flexibility of just a few degrees such as the conventional copper-clad fiber-glass epoxy laminates. More recently, printed circuits are being prepared on highly flexible film substrates to form electronic packages which may be folded and refolded one or more times to fit a specified configuration or a dynamic mechanical operation.

The defined resist layer thus produced can now be selectively etched, electroplated or treated with solder on the substrate. Particulary high demands are placed on photoresist films if they are used as permanent coatings that function as solder resists or masks. In this case, the developed, photopolymerized layer must withstand temperatures up to 300° C. without degradation, loss of adhesion or accumulation of residues contained in or on the molten solder. With the advanced technology of today's primed circuit boards, it is important to have the capability to photoimage a solder mask. According to the current state of the art, such solder masks can be made by spraying, coating or calendering liquid compositions on a substrate or also by laminating a dry film on a substrate.

Due to the adverse environmental impact of solvents, aqueous developable photopolymer systems with fast development are now preferred. The use of photopolymer resists with acid functions, primarily carboxyl functions, is known to impart aqueous processability. However, these groups are disadvantageous in many subsequent steps or events. In the case of photoresists, delamination of the resist is observed in alkali etching or gold plating, in the case of solder masks, inadequate climatic resistance results. Modification of the carboxyl groups with melamine compounds to overcome the named disadvantages is known (EP 0 115 354 and U.S. Pat. No. 4,247,621).

The utilization of polymers containing carboxylic acid groups that are subsequently converted to less reactive and less moisture sentitive species is also known. U.S. Pat. No. 4,987,054 discloses a photopolymerizable formulation yielding improved properties containing an acid copolymeric binder wherein a copolymer structural unit is the half acid/amide of a dicarboxylic acid. The disclosed formulations are used with conventional rigid printed circuit boards, processed with wholly aqueous alkaline solutions and are storage stable. European Patent Application 0 430 175 discloses a photopolymeric system similar to U.S. Pat. No. 4,987,054.

As the electronic industry is driven towards faster, more reliable and compact devices, there is an increasing need in the printed circuit field for a more pliable, permanent coating that can withstand typical manufacturing process conditions, such as molten solder, and continuously varying environmental conditions while maintaining its integrity. The capability of such a coating to stand up to varied conditions and, in addition, be photoimageable and aqueous processable would constitute an advancement of the art. Current protective coatings for polyimide flexible circuitry require mechanical punching or drilling before lamination in an overall costly, low productivity process. Of particular use would be a photoimageable, aqueous processable, permanent coating for use with flexible circuitry that can be made with conventional lower cost photoforming manufacturing processes that have higher resolution capability, wherein the flexible circuits can be subjected to flexural stress and maintain functionality.

SUMMARY OF THE INVENTION

These needs are met by the pliable, aqueous processable, photopolymerizable, permanent coating composition of this invention comprising:

(a) a cobinder system comprising in admixture
  (i) at least one low molecular weight copolymer binder having a molecular weight ranging from 2,000 to 10,000, wherein from 50 to 95 percent by weight of said low molecular weight copolymer binder comprises structural unit A

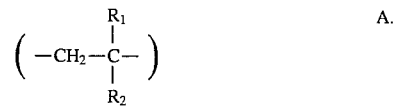

and from 5 to 50 percent by weight of said low molecular weight copolymer binder comprises at least one structural unit $B_1$, $B_2$ or combinations thereof containing carboxyl groups

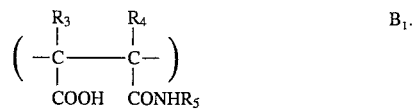

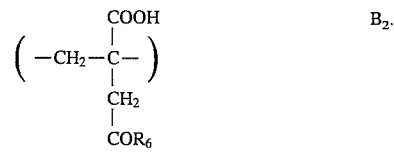

wherein $R_1$ is H, alkyl, phenyl or alkylphenyl;

$R_2$ is H, $CH_3$, phenyl, —$COOR_7$, —$CONR_8R_9$ or —CN;

$R_3$ and $R_4$ independently are H or alkyl;

$R_5$ is alkyl or aryl which are unsubstituted or substituted with primary amino, secondary amino, tertiary amino, hydroxy or ether groups or mixtures thereof;

$R_6$ is —OH or —$NHR_5$; and $R_7$, $R_8$ and $R_9$ independently are H, alkyl or aryl, which are unsubstituted or substituted with one or more hydroxy, ester, keto, ether or thioether groups; and (ii) at least one high molecular weight carboxylic acid-containing copolymer binder having a molecular weight ranging from 50,000 to 500,000;

(b) a monomeric component which is an acrylated urethane;

(c) a photoinitiator or a photoinitiator system; and (d) a thermal cross-linking agent.

DETAILED DESCRIPTION OF THE INVENTION

The present invention relates to an aqueous processable, permanent, photopolymerizable composition for use as a pliable protective coating for flexible circuitry comprising as essential ingredients (a) a cobinder system, (b) an acrylated urethane monomeric component, (c) a photoinitiator or photoinitiator system, and (d) a thermal cross-linking agent as specifically described hereinafter.

(a) Cobinder System

The cobinder system essential to the invention contains a low molecular weight copolymer binder component formed from 50 to 95% by weight of at least one structural unit A and 5 to 50% by weight of at least one structural unit $B_1$ and/or $B_2$ containing carboxyl groups, wherein A, $B_1$ and $B_2$ have the structures:

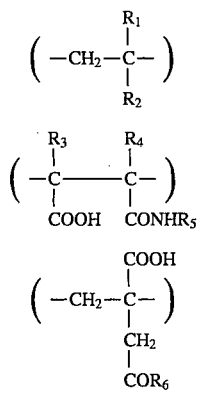

wherein $R_1$ is H, alkyl, phenyl or alkylphenyl, preferably H or $CH_3$;

$R_2$ is H, $CH_3$, phenyl, —$COOR_7$, —$CONR_8R_9$ or —CN, preferably phenyl, —$COOR_7$ or $CONR_8R_9$;

$R_3$ and $R_4$ independently are H or alkyl;

$R_5$ is alkyl or aryl which are unsubstituted or substituted with primary amino, secondary amino, tertiary amino, hydroxy or ether groups or mixtures thereof;

$R_6$ is —OH or $NHR_5$; and $R_7$, $R_8$ and $R_9$ independently are H, alkyl or aryl, which are unsubstituted or substituted with one or more hydroxy, ester, keto, ether or thioether groups, preferably unsubstituted or hydroxy substituted alkyl or aryl groups.

The proportion of structural unit A ranges from 50 to 95% by weight, preferably from 65 to 90% by weight and the proportion of structural unit $B_1$ and/or $B_2$ ranges from 5 to 50% by weight, preferably from 10 to 35% by weight. It is understood that these percentages exclude the terminal portions of the binder.

The low molecular weight copolymer binder containing adjacent carboxyl and amide groups can be formed by direct copolymerization of one or more ethylenically unsaturated dicarboxylic acids, which after dehydration, form structural units $B_1$ and/or $B_2$, with one or more comonomers which form structural unit A, followed by reaction of primary amines or anhydrous ammonia with the resultant copolymers that are formed by the copolymerization. Suitable ethylenically unsaturated dicarboxylic acid anhydrides which form structural units $B_1$ and/or $B_2$ are, for example, maleic acid anhydride, itaconic acid anhydride and citraconic acid anhydride. The proportion of ethylenically unsaturated dicarboxylic acid anhydrides in the copolymer binder ranges from 5 to 50% by weight, preferably from 10 to 35% by weight.

Primary aliphatic or aromatic, optionally substituted amines can be used in the invention. Substituents can be the following functional groups: primary amino, secondary amino, tertiary amino, hydroxy, ester, keto, ether and/or thioether groups. Propylamine, butylamine, octylamine, aminopropanol, aminoethanol, aminophenol, 1,2-diaminoethane, 1,3-diaminopropane, 1,3-diaminopentane, N-methyl-1,2-diaminoethane, N-ethyl-1,2-diaminoethane, N,N-dimethyl-1,2-diaminoethane, or N-(2-hydroxyethyl)-1,2-diaminoethane are preferred.

Suitable comonomers, which form the structural unit A of the copolymer binder, are styrene, substituted styrenes, and unsaturated carboxylic acids and their derivatives, such as, for example, (meth)acrylic acid, (meth)acrylic acid amides and (meth)acrylates. Methyl methacrylate, methyl acrylate, acrylamide, ethyl acrylate, butyl (meth)acrylate, and styrene are preferred.

The amic acid copolymer binder derived from the ethylenically unsaturated dicarboxylic acid anhydride has a molecular weight in the range of from 2,000 to 10,000, preferably from 3,000 to 6,000. The preferred molecular weight range can be influenced by the use of an aliphatic amine that contains primary, secondary or tertiary amino substitution which leads to lower solubility resins at the higher end of the molecular weight range.

When the permanent coating is photoprinted, development of the composition requires that the copolymer binder material contains sufficient acidic or other groups to render the composition processable in aqueous alkaline developer. The coating layer formed from the composition is removed in portions which are not exposed to radiation but is substantially unaffected in exposed portions during development by aqueous alkaline liquids such as wholly aqueous solutions containing 1% sodium or potassium carbonate by weight for a time period of five minutes at a temperature of 40° C.

The permanent coating composition of the invention additionally contains at least one high molecular weight carboxylic acid-containing copolymer binder component to modify coated film integrity, adhesion, hardness, oxygen permeability, moisture sensitivity and other mechanical or chemical properties required during its processing or end use. Suitable high molecular weight copolymer cobinders, which are used in combination with the low molecular weigh copolymer binder component, include as comonomers:

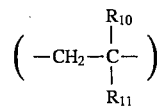

wherein $R_{10}$ is H, alkyl, —CN, phenyl or alkylphenyl;

$R_{11}$ is phenyl, alkylphenyl or —$CO_2R_{12}$ and $R_{12}$ is H or alkyl. Preferred comonomers for use in the cobinder are styrene, (meth)acrylic acid and methyl, ethyl and butyl-(meth)acrylate. (Meth)acrylic acid is an especially preferred comonomer in the cobinder for aqueous alkaline development.

The proportion of the low molecular weight copolymer binder component containing adjacent carboxyl and amide groups ranges from 5 to 50 weight % and the proportion of the high molecular weight carboxylic acid copolymer binder component ranges from 50 to 95 weight %, based on the total weight of the cobinder system.

A preferred cobinder system comprises an admixture of from 2,000 to 10,000 low moleclar weight resin of a reaction product of a primary amine with a copolymer formed from at least one ethylenically unsaturated dicarboxylic acid anhydride and at least one ethylenically unsaturated comonomer, and from 50,000 to 500,000 high molecular weight carboxylic acid-containing copolymer.

(b) Acrylated Urethane Monomeric Component

It has been found that the presence of an acrylated urethane is essential, since it imparts increased flexibility to the cured layer and reduced brittleness, when used in the correct proportion with the other essential ingredients of the invention. It is known that many factors influence the properties (e.g., glass transition temperature) and thus performance of urethane structures in a particular application. These factors include diisocyanate type, diol type (i.e., polyester, polyesteramide, polyether), diol molecular weight, codiols (i.e. short chain diols), ratio of diol to codiol, as well as the amount of branching and molecular weight of the resultant polyurethane. Properties after acrylation will vary correspondingly. It is important to choose the proper acrylated urethane and amount of such relative to other essential ingredients in order to obtain a proper balance of flexibility, toughness and chemical resistance in the permanent coating. The acrylated urethane is present in an amount of 5 to 30 parts by weight.

Preferred types of acrylated urethanes have the structure of formula (I):

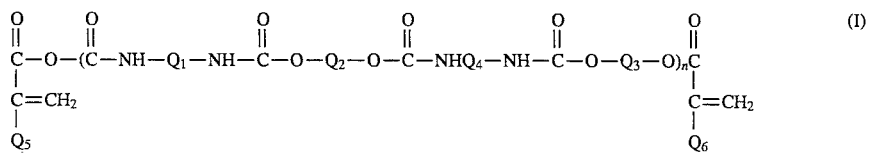

wherein $Q_1$ and $Q_4$ are aromatic groups which may be unsubstituted or substituted by lower alkyl groups and which can contain a lower alkylene group as a connecting member; $Q_2$ and $Q_3$ are independently polyoxyalkylene containing 1 to 10 carbon atoms; $Q_5$ and $Q_6$ are independently alkyl of 1 to 3 carbon atoms or H, and n is at least one.

Suitable co-monomers which can be used in combination with the acrylated urethane include the following: 1,5-pentanediol diacrylate, diethylene glycol diacrylate, hexamethylene glycol diacrylate, 1,3-propanediol diacrylate, decamethylene glycol diacrylate, decamethylene glycol dimethacrylate, 1,4- cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl) ether of bisphenol-A, di-(2- acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, triethylene glycol dimethacrylate, trimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, 1,4-benzenediol dimethacrylate, and 1,3,5-triisopropenyl benzene and polycaprolactone diacrylate. Excessive amounts of trifunctional acrylate monomers can result in reduction of required flexibility.

A particularly preferred class of comonomers is hydroxy $C_1$–$C_{10}$-alkyl acrylate, hexamethylene glycol diacrylate, triethylene glycol diacrylate, tripropylene glycol diacrylate, pentaerythritol triacrylate, trimethylolpropane triacrylate, polyoxyethylated trimethylolpropane triacrylate, di-(3-acryloxy-2-hydroxypropyl) ether of bisphenol-A, di-(3-acryloxy-2-hydroxypropyl) ether of tetrabromo-bisphenol-A, or methacrylate analogues thereof.

(c) Photoinitiator system

The photoinitiator system has one or more initiator compounds that directly furnish free-radicals when activated by actinic radiation. The system also may contain a sensitizer that is activated by the actinic radiation, causing the initiator compound to furnish the free-radicals. The sensitizer may extend spectral response into the near ultraviolet, visible, and near infrared spectral regions.

Numerous conventional photoinitiator systems are known to those skilled in the art and may be used provided they are compatible with the other ingredients of the coating composition. A large number of free-radical generating compounds, including redox systems such as Rose Bengal/2-dibutylaminoethanol, may be selected to advantage. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et al., U.S. Pat. No. 3,652,275, and the arylidene aryl ketones disclosed in Dueber, U.S. Pat. No. 4,162,162, which are incorporated herein by reference.

Preferred photoinitiator systems are 2,4,5-triphenylimidazolyl dimers in combination with chain transfer agents, or hydrogen donors, such as are disclosed in U.S. Pat. Nos. 3,479,185; 3,784,557; 4,311,783; and 4,622,286 which are incorporated herein by reference. Preferred hexaarylbiimidazoles (HABI) are 2-o-chlorosubstituted hexaphenylbiimidazoles in which the other positions on the phenyl radicals are unsubstituted or substituted with chloro, methyl or methoxy. The most preferred initiator is o-Cl-HABI, i.e., 1,1'-biimidazole, 2,2'-bis(o-chlorophenyl)-4,4',5,5'-tetraphenyl-imidazole dimer.

Hydrogen donor compounds that function as chain transfer agents in the photopolymer compositions include: 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

A particularly preferred class of photoinitiators and photosensitizers are benzophenone, Michler's ketone, ethyl Michler's ketone, p-dialkylaminobenzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof where alkyl contains 1 to 4 carbon atoms.

(d) Thermal Cross-linking Agent

Suitable cross-linking agents useful in the present invention are those in the prior art and include those disclosed in Gervay, U.S. Pat. No. 4,621,043 and Geissler et al., U.S. Pat. No. 4,438,189, such as formaldehyde condensation resins with melamines, ureas, benzoguanamines and the like.

A thermally activated cross-linking agent cross-links with reactive functionality, such as hydroxyl, carboxyl and amide groups, which are present in binders and other ingredients in the coating formulation. The presence of the proper cross-link imparts the capability to withstand molten solder temperature and improves chemical resistance or other mechanical or chemical properties required in the end-use product. A preferred thermal cross-linking agent is an aldehyde condensation product, used as resin precursors, such as that from the reaction of melamine and formaldehyde. Stability of an aldehyde condensation resin precursor in the presence of an acid binder is important for the shelf life stability of the composition. A binder having an acid number of at least 45 and a pKa value of at least 5, measured in 1:1 volume ratio of methanol to water, will not react in a short time period to form the cross-linkable aldehyde resin at a temperature significantly lower than 120° C.

Since a thermal cure is necessary for the reaction to proceed, extended storage time can be obtained for the photosensitive coverlay composition, conventionally present as a film. In addition, it is possible to laminate the film to a support at a temperature of 120° C. or lower without initiating the thermal cure reaction between the acid binder and the aldehyde condensation product.

Aldehyde condensation products, or resin precursors, suitable for the practice of the present invention may comprise from 1 to 30 weight percent of the coverlay composition. A single compound or a combination of compounds may be used. The preferred amount of condensation product in a permanent coating is 3 to 15 wt. %.

Examples of suitable cross-linking compounds include: N-methylol compounds of organic amides such as: N,N'-dimethylolurea, N,N'-dimethyloloxamide, N,N'-dimethylolmalonamide, N,N'-dimethylolsuccinimide, N,N'-dimethylolsebacamide, N,N'N"-trimethylolcitramide, 1,3-dimethylolimidazolidine-2-one, 1,3-dimethylol-4,5-dihydroxyimidaolzidine-2-one, 1,3-dimethylolperhydropyrimidine-2-one, trimethylolmelamine, tetramethylolmelamine, hexamethylolmelamine, 1,3-dimethylol-5-methylperhydro-1,3,5-triazine-2-one, 1,3-dimethylol-5-allylperhydro-1,3,5-triazine-2-one, 1,3-dimethylol-5-butylperhydro-1,3,5-triazine-2-one, 1,2-bis-[1,3-dimethylolperhydro-1,3,5-triazine-2-one-5-yl] ethane, tetramethylolhydrazine dicarboxamide, N,N'-dimethylolterephthalamide, N,N'-dimethylolbenzene-1,3-disulfonamide and tetramethylolglycoluril; and C-Methylol compounds of phenols, phenolethers and aromatic hydrocarbons, 2,4,6-trimethylolphenol, 2,6-dimethylol-4-methylanisole, 2,6-dimethylol-4-methylphenol, 1,3-dimethylol-4,6-diisopropylbenzene, 2,2-bis-(4-hydroxy-3,5-dimethylolphenyl)propane, and 3,3'-dimethylol-4,4'-dihydroxydiphenyl sulfone.

Instead of the aforementioned methylol compounds, it is also possible to use, for example, the corresponding methyl, ethyl or butyl ethers, or esters of acetic acid or propionic acid. Suitable examples include: 4,4'-bismethoxymethyldiphenyl ether, tris-methoxymethyldiphenyl ether, tetrakismethoxymethyl hydrazinedicarboxamide, tetrakis-methoxymethylglycoluril, tetrakis-hydroxyethoxymethylglycoluril, bis-acetoxymethyldiphenyl ether, hexamethoxymethylmelamine. Preferred examples of methylol ethers are those from aldehyde condensation products with melamines, ureas and benzoguanamines. Particularly preferred choices are hexamethoxymethyl-melamine and the butyl ether of the formaldehyde condensation product with melamine.

Polyols reactive with aldehyde condensation products, or resin precursors, can be added to improve processing characteristics and physical properties such as moisture resistance and cured film strength and toughness. Suitable materials are poly(propylene oxide) polyols, poly(butylene oxide) polyols, poly(tetramethylene ether glycol) polyols, hydroxyl-terminated polybutadiene polyols and polyurethane polyols.

Fillers

The aqueous processable, photopolymerizable permanent coating compositions of this invention may contain a preformed macromolecular elastomeric component as an organic filler. This elastomeric component typically is present as a separate micro-phase in the aqueous processable permanent coating composition, and as such is believed to be functioning as an elastomeric filler for the composition. Typically, such organic components contain substantially no acidic groups and consequently are insoluble in aqueous, alkaline developer solutions. However, dispersibility in the permanent coating composition and aqueous, alkaline developer solutions may be improved by incorporating sufficient carboxylic acid groups into the organic filler component if improvement in such development is required.

Although many elastomers may be used in the permanent coating composition, poly(methyl methacrylate-co-butadiene-co-styrene) is preferred. Other organic fillers which may be used include synthetic rubbers, e.g., butadiene-co-acrylonitrile, acrylonitrile-co-butadiene-co-styrene, methacrylate-co-acrylonitrile-co-butadiene-co-styrene copolymers, and styrene-co-butadiene-co-styrene, styrene-co-isoprene-co-styrene block copolymers; saturated polyurethanes; poly(methylmethacrylate-co-butylacrylate); and the like. Further examples of organic filler components include conventional elastomers as defined on page 232 of "Hackh's Chemical Dictionary" Fourth Edition, Edited by J. Grant, McGraw-Hill Book Company, 1972.

The permanent coating compositions may also contain other organic fillers or inorganic particulates to modify the mechanical or chemical properties required during its processing or end use. Suitable fillers include organic or inorganic reinforcing agents which are essentially transparent as disclosed in U.S. Pat. No. 2,760,863, e.g., organophilic silica bentonite, silica, and powdered glass having a particle size less than 0.4 mil; inorganic thixotropic materials as disclosed in U.S. Pat. No. 3,525,615 such as boehmite alumina, clay mixtures of highly thixotropic silicate oxide such as bentonite and finely divided thixotropic gel containing 99.5% silica with 0.5% mixed metallic oxide; microcrystaline thickeners as disclosed in U.S. Pat. No. 3,754,920 such as microcrystalline cellulose and microcrystalline silicas, clays, alumina., bentonite, kalonites, attapultites, and montmorillonites; finely divided powders having a particle size of 0.5 to 10 micrometers as disclosed in U.S. Pat. No. 3,891,441 such as silicon oxide, zinc oxide, and other commercially available pigments; and the binder-associated, transparent, inorganic particles as disclosed in European Patent Application 87113013.4 such as magnesium silicate (talc), aluminum silicate (clay), calcium carbonate and alumina. Typically, the filler will be transparent to actinic radiation to preclude adverse effects during imaging exposure. Depending on its function in the photopolymerizable composition, the filler may be colloidal or have an average particle size of 0.5 micrometers or more in diameter.

Adhesion Promoter

The permanent coating composition may also contain a heterocyclic or mercaptan compound to improve adhesion of the coating to the metal circuit pattern during processing or in the end-use product. Suitable adhesion promotors include heterocyclics such as those disclosed in Hurley et al., U.S. Pat. No. 3,622,334, Jones, U.S. Pat. No. 3,645,772, and Weed, U.S. Pat. No. 4,710,262, which are incorporated herein by reference. Preferred adhesion promoters include benzotriazole, 5-chloro-benzotriazole, 1-chloro-benzotriazole, 1-carboxy-benzotriazole, 1-hydroxy-benzotriazole, 2-mercapto benzoxazole, 1H-1,2,4-triazole-3-thiol, 5-amino-1,3,4-thiadiazole-2-thiol, and mercapto-benzimidazole.

Other Components

Other compounds conventionally added to photopolymer compositions may also be present in the permanent coating to modify the physical properties of the film. Such components include: thermal stabilizers, colorants such as dyes and pigments, coating aids, wetting agents, release agents, and the like.

Thermal polymerization inhibitors that can be used in the permanent coating compositions are: Irganox® 1010, p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

On the basis of the components (a) a cobinder system containing a copolymer component having amine-reacted anhydride functionality and a carboxylic acid-containing copolymer; (b) acrylated urethane; (c) photoinitiator system; and (d) thermal cross-linking agent, a suitable concentration is component (a) present in an amount of 5 to 80 parts by weight, component (b) present in an amount of 10 to 40 parts by weight, component (c) present in an amount of 0.5 to 10 parts by weight, and component (d) present in an amount of 2 to 30 parts by weight.

Permanent Coating Applications

The process of the invention is a secondary imaging process to make permanent coatings, i.e., a solder mask, to protect the printed circuit during subsequent processing, primarily solder operations, and/or from environmental effects during use. Permanent coatings also are used as intermediate insulative layers, with or without development, in the manufacture of multilayer printed circuits.

In practice, a photopolymerizable, permanent coating layer, typically between 10 and 125 micrometers (0.4 and 5 mils) thick, is applied to a printed circuit substrate which typically is a printed circuit relief pattern on a substrate that is semi-rigid, such as fiberglass reinforced epoxy, or on a flexible film substrate based on polyimide or polyester film. The applied photopolymerizable, permanent coating layer is then imagewise exposed to actinic radiation to harden or insolubilize exposed areas. Any unexposed areas are then completely removed typically with an alkaline, aqueous sodium or potassium carbonate developer solution which selectively dissolves, strips or otherwise disperses the unexposed areas without adversely affecting the integrity or adhesion of the exposed areas. The developed permanent resist image is first treated to further cure or harden it by baking at elevated temperatures, such as one hour at 150° C., by additional uniform exposure to actinic radiation or a combination thereof to produce a circuit board having a cured permanent resist layer covering all areas except pad or through-hole areas. Electrical components are then inserted into the through-holes or positioned on surface mount areas and soldered in place to form the packaged electrical component.

The photopolymerizable permanent coating may be applied to a printed circuit substrate either as a liquid, as a pre-formed dry film, or as a combination of a liquid and dry film.

Coating Liquids

The photopolymerizable, permanent resist may be coated as a liquid onto the printed circuit substrate using any conventional coating process. The liquid may be a solution of the permanent coating composition wherein the solvent is removed subsequent to coating to form a dry, solid, coverlay layer, or the liquid may be a neat, solvent-free, permanent coating composition which, subsequent to coating, is directly imaged or exposed to actinic radiation to form a hardened coverlay layer. The liquids may be roller-coated, spin-coated, screen-coated or printed as disclosed in Coombs supra, in DeForest supra, in Lipson et al., U.S. Pat. No. 4,064,287, or in Oddi et al., U.S. Pat. No. 4,376,815. The liquid, typically as a solution, may also be curtain coated as disclosed in Losert et al., U.S. Pat. No. 4,230,793 or may be applied by electrostatic spray. In the instance when printed circuits are manufactured on a continuous web of film substrate, permanent coating liquid may be coated by any conventional web coating process.

Dry Film Lamination

A pre-formed, dry-film, photopolymerizable permanent coating layer is applied from a multi-ply, transfer, coverlay element using the lamination process as described in Celeste, U.S. Pat. No. 3,469,982. The multi-ply, permanent coating element comprises, in order, an actinic-radiation transparent, temporary support film, e.g., polyethylene terephthalate or silicon treated polyethylene terephthalate, a thin photopolymerizable, permanent coating layer, and optionally a removable cover sheet, e.g., polyethylene or polypropylene, to protect the permanent coating element during storage. The photopolymerizable, permanent coating layer, is present in a range of thickness from 10 to 125 microns (0.4 to 5 mils) when used over printed circuit substrates. As described in Celeste supra, the cover sheet, if present, is first removed and the uncovered permanent coating surface is laminated to the pre-cleaned copper printed circuit surface of the substrate using heat and/or pressure, e.g., with a conventional hot-roll laminator. Although the laminate is typically imagewise exposed to actinic radiation through the temporary support film, in some instances, the temporary support may be removed before imaging to improve resolution and other such properties. In some instances permanent coating adhesion to the substrate can be improved by treating the substrate surface with a liquid at or just prior to lamination. The liquid may be insensitive to actinic radiation and may be a solution of adhesion promoters as disclosed in Jones, U.S. Pat. No. 3,645,772, a solvent or swelling agent for the coverlay layer such as disclosed in Fickes, U.S. Pat. No. 4,069,076, a non-solvent, such as disclosed in Cohen, U.S. Pat. No. 4,405,394 and European Patent 0041639, Pilette et al., U.S. Pat. No. 4,378,264, and Weiner et al., European Patent 0040842, or a liquid component of the permanent coating layer such as disclosed in Lau et al., U.S. Pat. No. 4,698,294. The liquid in some instances may be photosensitive. Typically, when a dry film is laminated to a printed circuit substrate having a low circuit relief, measures must be taken to eliminate entrapped air, e.g., from around circuit lines. Entrapped air is eliminated by the vacuum lamination process of Friel U.S. Pat. No. 4,127,436, by the grooved roll lamination process of Collier et al., U.S. Pat. No. 4,071,367, or by using liquid treating agents as described in Fickes supra and Lau et al. supra.

Permanent Coating Flexibility Testing

Printed circuits must withstand a variety of tests that are dependent on the application of the circuits, which in turn governs the type of material used as the circuit substrate. Rigid printed circuits are typically used in computers, telecommunications, transportation and consumer industries. Many manufacturers supply printed circuits for these applications to the Military, which necessitates testing according to Military Specification MIL-P-55110D, including the thermal shock requirement. A more stringent application is for flexible printed circuits which require a fold or bend for a particular space requirement, such as a camera or a video cassette recorder (VCR), and may require the capability to survive multiple bends, an extreme example being a computer disc drive. In some applications a flexible circuit is combined with a rigid circuit to form a flex-rigid multilayer printed circuit. The end use tests for flexible circuits focus on adhesion and the capability to withstand single or multiple bends. In addition, accelerated aging is a useful test to simulate the practical concern of film aging on standing at ambient conditions for an extended period of time. This accelerated aging by exposure of the film to hot air is effective for identification of film components that may oxidize more quickly than others. The tests that are used to support the Examples in this application are described herein.

Thermal Shock

This test is documented in the U.S. Military Specification MIL-P-55110D as Thermal Shock 3.9.3 and 4.8.6.3. Test specimens are printed circuit boards with a standard test pattern. Specimens are tested for 100 cycles in accordance with the following test conditions:

Minus 65° C. for fifteen minutes and then plus
125° C. for fifteen minutes.

Transfer time between chambers is less than two minutes. The thermal capacity of the test chamber shall be such that the ambient temperature shall reach the specified temperature within two minutes after the specimen has been transferred to the appropriate chamber. At the end of 100 cycles the sample is inspected at 10× magnification for delamination or microcracks; evidence of either constitutes a failed specimen.

Bend & Crease and Cross-Hatch Tests

The section of laminate from which test specimens are obtained will be no smaller than four inches by four inches. The permanent coating to be tested is applied typically to Pyralux® LF-9110 and processed as previously described. A minimum test specimen size will be ¾ inches by 4 inches, which allows both Bend & Crease and Cross Hatch tests to be done on the same sample.

Before Solder Dip

1. The ¾ inch by four inch processed specimen should be clean, unblemished and dry. It will be examined prior to testing for microcracks, delamination, tears, ridges, blistering and the like under 2×–7× magnification. The presence of the aforementioned defects constitutes a failure in the test specimen.

2. The cross-hatch will be applied to the sample according to ASTM D-3359-83. Any residual flakes of the permanent coating as a result of this operation are removed by brushing lightly with a soft brush and the specimen inspected as in 1 above.

3. One inch width, semi-transparent pressure-sensitive tape with an adhesion strength of 40±2.5 oz./in. is then applied to the center of the cross-hatch sample. Within 90 seconds of application, the tape is removed by seizing the free end and rapidly pulling it off at an approximate 180° angle and the specimen inspected as in 1 above.

4. The specimen is folded in half by length and then creased between the index finger and thumb using adequate pressure to cause a crease in the specimen and the specimen inspected as in 1 above.

After Solder Dip

5. The specimen is immersed completely in solder (60/40) at 550° F. for ten seconds, allowed to cool at ambient temperature for one minute, and inspected as in 1 above.

6. Pressure-sensitive tape is applied to and removed from the cross-hatch area as in 3 above and the specimen inspected as in 1 above.

7. A bend & crease will be applied to the specimen as in 4 above and the specimen inspected as in 1 above.

Flex/Bend Test

This test determines the capability of a permanent coating to withstand multiple flex cycles and the procedure follows:

1. Apply the permanent coating to Pyralux® LF-9110, such that bare copper laminate is exposed on opposite ends, and process as previously described. Cut ½ inch strips to serve as test specimens.

2. The specimen will be mounted into a Universal Mfg. Co., Inc. Model #2FDF bend tester with a mandrel diameter of 0.079 inches and a 3 oz. weight. The specimen will be cycled 5×, 10×, then in increments of 10 cycles, evaluating the specimens for conductivity after each increment.

3. A HP3478A Multimeter on auto-range and 2 wire Ohm scale is used to determine if the specimen is conductive. The positive and negative probes of the Multimeter will be connected to the bare copper ends of the prepared specimen and a control measurement taken to insure a reading of zero, or no current flow.

4. A drop of Vend-Rite™ Solution, which is a saturated salt solution, will be placed onto the portion of the permanent coating exposed to the bend test, making sure the droplet does not contact the specimen edge. The positive probe will be placed at an approximate 45° angle in the Vend-Rite™ Solution droplet in such a manner that the probe does not puncture the permanent coating. The negative probe will be placed on the bare copper laminate edge and a current measurement taken. A zero reading indicates no current flow and will be a pass. A positive reading indicates current flow as a result of cracks in the permanent coating and will be a failure.

Accelerated Aging

Test Specimens are exposed to 110° C. in an air circulating oven for the specified number of days. A preferred cured coating of the present invention has an ability to pass at least one and peferably all of the above tests after accelerated aging at 110° C. for four days and most preferably after aging for ten days.

EXAMPLES

To further substantiate the invention, the examples below are provided. Materials used for the examples are:

| Co-binders | |
|---|---|
| Carboset® 525 | Copolymer of ethyl acrylate, methyl methacrylate and acrylic acid (56/37/7) from B. F. Goodrich, Cleveland, OH. |
| Monomers | |
| Ebecryl® 3704 | Diacrylate of bisphenol-A diglycidyl ether from Radcure, Altlanta, GA. |
| Ebecryl® 6700 | Urethane diacrylate from Radcure. |
| Thermal Crosslinking Agents | |
| Cymel® 1158 | Butyl ether of dimer and trimers formed from the condensation of melamine and formaldehyde from American Cyanamide, Wayne, NJ. |
| Organic Filler | |
| Paraloid® 9011CXP | Core/shell polymer from Rohm and Haas. |
| Adhesion Promoter | |
| 3 MT | 3-Mercapto-1H-1,2,4-triazole from Esprit Chemical Co., Rockland, MA. |
| Initiator | |
| o-Cl HABI | Hexaarylbiimidazole |
| EMK | Ethyl Michler's ketone. |
| Other Ingredients | |
| Dayglo® 122-9655 | Green pigment from Dayglo Corp., Cleveland, OH. |
| Dayglo® 66-D-888 | Green pigment from Dayglo Corp. |
| Irganox® 1010 | Antioxidant from Ciba Geigy Corp., Ardsley, N.Y. |
| PVPK-90 | Polyvinylpyrrolidone from GAF Chemicals Corp., Texas City, TX. |

Low MW Amic Acid Preparation

A representative procedure for the preparation of the amic acid containing binder is presented. Amic acid #1 used in Examples 1 and 2 was prepared from a copolymer of itaconic anhydride/itaconic acid/butyl acrylate/butyl methacrylate/styrene, 23/4/38/20/15, weight average molecular weight of 4,000 with the following components:

| Component | Grams |
|---|---|
| Copolymer at 65% solids in a mixture of ethyl acetate, xylene and propylene glycol ethyl ether acetate. | 153.8 |
| Ethyl acetate | 202.4 |
| Methanol | 25.1 |
| n-butylamine | 20.5 |

The butylamine was added to the stirred copolymer solution and stirring was continued for 4 hours. The copolymer was precipitated in 2000 g of petroleum ether, with stirring; the solvent was poured off and the precipitated polymer air dried. Amic Acid #2 below was not precipitated and isolated, but prepared as the first step in the coating composition.

Amic Acid #2, used in Example 3, was prepared from the same copolymer as was used to prepare Amic Acid #1, at weight average molecular weight 4,000, except that excess xylene was vacuum distilled from this resin solution and methanol and ethyl acetate added to give a final solvent mixture of 23% methanol, 74% ethyl acetate, and 3% xylene. The final composition was prepared by stirring the copolymer plus additional ethyl acetate, as a solution of the amine in methanol was added slowly as follows:

| | Grams |
|---|---|
| Component | |
| Copolymer at 64.6% solids | 100.0 |

| | Grams |
|---|---|
| Ethyl acetate | 23.9 |
| Amine solution | |
| 2(2-aminoethylamino)ethanol | 14.35 |
| Methanol | 39.7 |

The mixture thickened with an exotherm to 33° C. The solution contained 44.8% solids. Example 3 used a preformed solution of Ebecryl® 3704 and 6700 each at 75% solids in ethyl acetate.

Permanent Coating Formation

The coating solutions were coated on 0.001 inch Mylar® polyethylene terephthalate support using a 0.01 inch coating knife to give approximately a 0.002 inch thick dried film composition, or using a laboratory solvent coater to give approximately a 0.002 inch thick dried film composition. The coating compositions (all weights are in grams) and test results are given in Table 1 for Examples 1 to 3.
Dry film processing conditions are as follows:

Exposure of the examples was at 300 mj/cm$_2$, except for Example 2, which was at 50 mj/cm$^2$. Development conditions were 105° F. and 90 seconds for Example 1 and 50 seconds for Examples 2 and 3. The thermal cure for the examples was 150° C. for one hour. Examples 1 to 3 were further exposed to an ultraviolet radiation cure of two joules.

TABLE 1

| | EXAMPLES | | |
|---|---|---|---|
| COMPONENT | 1 | 2 | 3 |
| Amio Acid | | | |
| #1 | 15.1 | 13.1 | — |
| #2 | — | — | 33.5 |
| Ethyl Acetate | 85.4 | 52.0 | 176.7 |
| Methanol | 21.4 | 12.6 | 108.8 |
| Carboset ® 525 | 24.2 | 21.8 | 62.4 |
| Paraloid ® 9011CXP | — | 49.6 | — |
| Ebecryl ® 3704 | 16.7 | 15.0 | 12.4 |
| Ebecryl ® 6700 | 22.2 | 20.0 | 16.5 |
| Cymel ® 1158 | 11.1 | 10.0 | 22.5 |
| 3-MT | 0.2 | 0.2 | — |
| o-Cl-HABI | 0.6 | 0.5 | 1.0 |
| Benzophenone | 4.4 | 4.0 | 4.0 |
| EMK | 0.1 | 0.1 | 0.2 |
| Dayglo ® 122-9655 | 3.9 | 3.5 | — |
| Dayglo ® 6G-D-888 | — | — | 0.6 |
| Irganox ® 1010 | 0.6 | 0.5 | — |
| PVPK 90 | 3.1 | 2.8 | 12.0 |

| | EXAMPLES | | |
|---|---|---|---|
| TEST RESULTS | 1 | 2 | 3 |
| No Heat Aging | | | |
| Thermal Shock Cross Hatch Adhesion | pass | pass | pass | pass |
| Before Solder | pass | pass | pass | pass |
| After Solder | pass | pass | pass | pass |
| Bend & Crease | | | | |
| Before Solder | pass | pass | pass | pass |
| After Solder | pass | pass | pass | pass |
| Heat Aging (# Days) | 10 | 10 | 4 | 10 |
| Post Heat Aging | | | | |
| Cross Hatch Adhesion | | | | |

TABLE 1-continued

| Before Solder | pass | pass | pass | pass |
|---|---|---|---|---|
| After Solder | pass | fail | pass | pass |
| Bend & Crease | | | | |
| Before Solder | pass | fail | pass | pass |
| After Solder | pass | fail | pass | pass |
| Flex Bend Test (# Cycles) | 130 | | | |

What is claimed is:

1. A pliable, aqueous processable, photopolymerizable, permanent coating composition comprising:
   (a) a cobinder system comprising in admixture
      (i) from 5 to 50 weight % of at least one low molecular weight copolymer binder having a molecular weight ranging from 3,000 to 6,000, wherein from 50 to 95 percent by weight of said low molecular weight copolymer binder comprises structural unit A

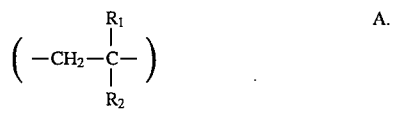

and from 5 to 50 percent by weight of said low molecular weight copolymer binder comprises at least one structural unit $B_1, B_2$ or combinations thereof containing carboxyl groups

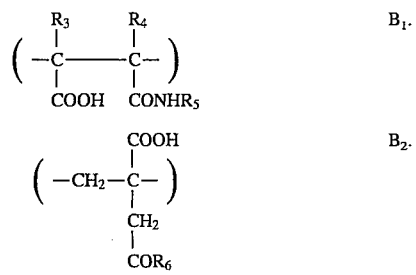

wherein
   $R_1$ is H, alkyl, phenyl or alkylphenyl;
   $R_2$ is H, $CH_3$, phenyl, $-COOR_7$, $-CONR_8R_9$ or $-CN$;
   $R_3$ and $R_4$ independently are H or alkyl;
   $R_5$ is alkyl or aryl which are unsubstituted or substituted with primary amino, secondary amino, tertiary amino, hydroxy or ether groups or mixtures thereof;
   $R_6$ is $-OH$ or $-NHR_5$;
   $R_7$, $R_8$ and $R_9$ independently are H, alkyl or aryl, which are unsubstituted or substituted with one or more hydroxy, ester, keto, ether or thioether groups; and
      (ii) from 50 to 95 weight % of at least one high molecular weight carboxylic acid containing copolymer binder having a molecular weight ranging from 50,000 to 500,000 comprising monomer units of the formula

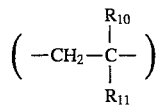

wherein $R_{10}$ is H, alkyl, $-CN$, phenyl or alkylphenyl;
   $R_{11}$ is phenyl, alkylphenyl or $-CO_2R_{12}$ and $R_{12}$ is H or alkyl wherein alkyl contains from 1 to 4 carbon atoms;
   (b) a monomeric component which is an acrylated urethane;

(c) a photoinitiator or a photoinitiator system; and (d) a thermally activated cross-linking agent.

2. The permanent coating composition of claim 1 wherein the low molecular weight copolymer binder (i) is the reaction product of a primary amine with a copolymer formed from at least one ethylenically unsaturated dicarboxylic acid anhydride and at least one ethylenically unsaturated comonomer.

3. The permanent coating composition of claim 2 wherein the ethylenically unsaturated dicarboxylic acid anhydride is selected from the group consisting of maleic acid anhydride, itaconic acid anhydride and citraconic acid anhydride.

4. The permanent coating composition of claim 2 wherein the primary amine is selected from the group consisting of a primary aliphatic amine and an aromatic amine which can be unsubstituted or substituted with primary amino, secondary amino, tertiary amino, hydroxy, ether groups, or mixtures thereof.

5. The permanent coating composition of claim 2 wherein the ethylenically unsaturated comonomer is selected from the group consisting of styrene, (meth)acrylic acid, (meth)acrylamides, and (meth)acrylates.

6. The permanent coating composition of claim 1 wherein the acrylated urethane has the structure:

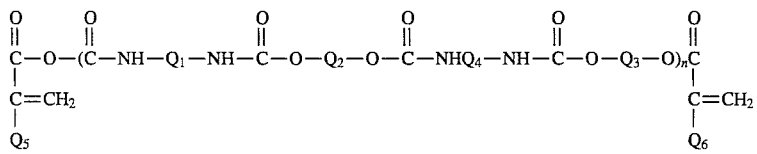

wherein n is at least one; $Q_1$ and $Q_4$ are aromatic groups which may be unsubstituted or substituted by lower alkyl groups and which can contain a lower alkylene group as a connecting member; $Q_2$ and $Q_3$ are independently polyoxyalkylene containing 1 to 10 carbon atoms; and $Q_5$ and $Q_6$ are independently alkyl of 1 to 3 carbon atoms or H.

7. The permanent coating composition of claim 1 wherein the monomeric component further comprises a comonomer.

8. The permanent coating composition of claim 7 wherein the comonomer is selected from the group consisting of hydroxy $C_1$–$C_{10}$-alkyl(meth)acrylate, hexamethylene glycol di(meth)acrylate, triethylene glycol di(meth)acrylate, tripropylene glycol di(meth)acrylate, pentaerythritol tri (meth)acrylate, trimethylolpropane tri(meth)acrylate, polyoxyethylated trimethylolpropane tri(meth)acrylate, di-(3-(meth)acryloxy-2-hydroxypropyl) ether of bisphenol-A, and di-(3-(meth)acryloxy-2-hydroxypropyl) ether of tetrabromo-bisphenol-A.

9. The permanent coating composition of claim 1 wherein the thermally activated cross-linking agent is a monomeric or polymeric aldehyde condensation product.

10. The permanent coating composition of claim 9 wherein the thermally activated cross-linking agent is a methylolether substituted melamine.

11. The permanent coating composition of claim 10 wherein the melamine ether is hexamethoxymethylmelamine.

12. The permanent coating composition of claim 9 wherein the thermally activated cross-linking agent is a formaldehyde condensation product with a compound selected from the group consisting of a melamine, a urea, and a benzoguanamine.

13. The permanent coating composition of claim 12 wherein the thermally activated cross-linking agent is a butyl ether of the formaldehyde condensation product with melamine.

14. The permanent coating composition of claim 1 wherein the low molecular weight copolymer binder comprises the reaction product of n-butyl amine with a copolymer of styrene, butyl methacrylate, butyl acrylate and itaconic acid anhydride.

15. The permanent coating composition of claim 1 wherein the high molecular weight carboxylic acid-containing copolymer comprises a copolymer of ethyl acrylate, methyl methacrylate and acrylic acid.

16. The permanent coating composition of claim 1 wherein the high molecular weight carboxylic acid-containing copolymer comprises a copolymer of methyl methacrylate, butyl acrylate and methacrylic acid.

* * * * *